United States Patent
Pöhlmann et al.

(10) Patent No.: US 9,379,812 B2
(45) Date of Patent: Jun. 28, 2016

(54) WDM PON WITH NON TUNABLE LEGACY ONUS

(75) Inventors: Wolfgang Pöhlmann, Hemmingen (DE); Thomas Pfeiffer, Stuttgart (DE); Ronald Heron, Rigaud (CA)

(73) Assignee: Alcatel Lucent, Boulogne-Billancourt (FR)

( * ) Notice: Subject to any disclaimer, the term of this patent is extended or adjusted under 35 U.S.C. 154(b) by 25 days.

(21) Appl. No.: 13/979,980

(22) PCT Filed: Jan. 31, 2012

(86) PCT No.: PCT/EP2012/051520
§ 371 (c)(1),
(2), (4) Date: Jul. 16, 2013

(87) PCT Pub. No.: WO2012/107321
PCT Pub. Date: Aug. 16, 2012

(65) Prior Publication Data
US 2013/0308937 A1    Nov. 21, 2013

(30) Foreign Application Priority Data
Feb. 11, 2011    (EP) ..................................... 11290084

(51) Int. Cl.
*H04B 10/07* (2013.01)
*H01S 5/00* (2006.01)
(Continued)

(52) U.S. Cl.
CPC .............. *H04B 10/07* (2013.01); *H01S 5/0014* (2013.01); *H04J 14/0221* (2013.01); *H04J 14/0282* (2013.01); *H01S 5/0607* (2013.01)

(58) Field of Classification Search
CPC .............................. H04B 10/07; H04J 14/0221

USPC ................................................. 398/25, 27, 68
See application file for complete search history.

(56) References Cited

U.S. PATENT DOCUMENTS

| | | | | |
|---|---|---|---|---|
| 6,687,433 B2 * | 2/2004 | Okuno | ............... | G02B 6/29376 385/27 |
| 7,636,525 B1 * | 12/2009 | Bontu | .................... | H04B 10/60 398/208 |

(Continued)

FOREIGN PATENT DOCUMENTS

| | | |
|---|---|---|
| CN | 1252654 A | 5/2000 |
| CN | 1722649 A | 1/2006 |

(Continued)

OTHER PUBLICATIONS

International Search Report PCT/ISA/210 for PCT/EP2012/051520 dated Mar. 19, 2012.

(Continued)

*Primary Examiner* — David Payne
*Assistant Examiner* — Omar S Ismail
(74) *Attorney, Agent, or Firm* — Harness, Dickey & Pierce, P.L.C.

(57) ABSTRACT

In one embodiment, a media access controller includes first and second optical line terminals with a receiver for adjacent first and second wavelength ranges, respectively, and an optical network unit with a transmitter having a transmitter wavelength which drifts between the first and the second wavelength range. The media access controller is configured to assign the optical network unit to the first and the second optical line terminals, such that an optical burst transmitted by the optical network unit is received by the first optical line terminal and the second optical line terminal. The media access controller is configured to determine first and second qualities of the optical burst received by the first and second optical line terminals, respectively, and to determine an estimate of the transmitter wavelength based on the first quality and the second quality.

13 Claims, 4 Drawing Sheets

(51) Int. Cl.
*H04J 14/02* (2006.01)
*H01S 5/06* (2006.01)

(56) References Cited

U.S. PATENT DOCUMENTS

| | | | | |
|---|---|---|---|---|
| 8,111,985 B2* | 2/2012 | Dvir | ................... | H04B 10/0795 398/154 |
| 2006/0120724 A1* | 6/2006 | Ishimura | ............. | H04J 14/0226 398/75 |
| 2008/0050119 A1* | 2/2008 | Effenberger | ........ | H04J 14/0226 398/68 |
| 2008/0193125 A1* | 8/2008 | Weber | ................ | H04B 10/0793 398/25 |
| 2008/0267627 A1 | 10/2008 | Effenberger | | |
| 2009/0202242 A1 | 8/2009 | Niibe et al. | | |
| 2010/0054739 A1* | 3/2010 | Lavillonniere | ........ | H04J 3/0682 398/67 |
| 2010/0226649 A1* | 9/2010 | Cheng | ................ | H04J 14/0209 398/72 |
| 2012/0008952 A1* | 1/2012 | Li | .......................... | H04B 10/50 398/65 |
| 2012/0148265 A1* | 6/2012 | Chang | ................ | H04B 10/6161 398/208 |
| 2012/0163809 A1* | 6/2012 | Sugawa | ............... | H04B 10/272 398/34 |
| 2012/0219287 A1* | 8/2012 | Treyer | ................. | H04J 14/0278 398/27 |
| 2012/0328305 A1* | 12/2012 | Rahn | ..................... | H04L 1/0047 398/202 |

FOREIGN PATENT DOCUMENTS

| | | |
|---|---|---|
| CN | 101127571 A | 2/2008 |
| CN | 101467366 A | 6/2009 |
| EP | 2088800 A2 | 8/2009 |
| EP | 2159937 A1 | 3/2010 |

OTHER PUBLICATIONS

Written Opinion PCT/ISA/237 for PCT/EP2012/051520 dated Mar. 19, 2012.
Chinese Office Action and Search Report dated May 25, 2015 for corresponding Chinese Application No. 201280008512.1.

* cited by examiner

WDM PON WITH NON TUNABLE LEGACY ONUS

This application is the national phase under 35 U.S.C. §371 of PCT International Application No. PCT/EP2012/051520 which has an International filing date of Jan 31, 2012, which designated the European Patent Office and which claims priority to European patent application number 11290084.0 filed Feb 11, 2011; the entire contents of each of which are hereby incorporated by reference.

The present document relates to optical transmission systems. In particular, the present document relates to a system and method enabling the coexistence of tunable and non-tunable Optical Network Units (ONUs) in a passive optical network (PON), e.g. a wavelength division multiplexing (WDM) PON.

For a WDM PON, tunable lasers are used within the ONUs and the Optical Line Terminal (OLT) to adjust the transmitter wavelength to the passband of a particular optical filter. Non-tunable legacy lasers are typically not usable in such a WDM PON, because their wavelength is uncontrolled and wilt therefore drift due to temperature changes. Consequently, the non-tunable lasers of legacy ONUs installed at customer premises cannot be used in WDM PONs. In the present document, methods and systems for enabling the use of non-tunable lasers, i.e. the use of un-controlled transmitters, within WDM PONs are described.

According to an aspect a media access controller for a passive optical network is described. The passive optical network (PON) comprises a first optical line terminal (OLT) with a receiver for a first wavelength range. The first wavelength range may be a first WDM channel of a WDM PON. Furthermore, the PON may comprise a second optical line terminal with a receiver for a second wavelength range. The second wavelength range may be a second WDM channel of a WDM PON. The second wavelength range may be adjacent to the first wavelength range. In particular, the first and second WDM channels may be adjacent, i.e. neighboring, WDM channels in a WDM PON. In addition, the PON may comprise an optical network unit (ONU), e.g. a non-tunable ONU, with a transmitter having a transmitter wavelength which drifts between the first and the second wavelength range. As such, the transmitter wavelength may take on any values from the first and/or the second wavelength ranges.

The media access controller may be configured to assign the optical network unit to the first and the second optical line terminal, such that an optical burst transmitted by the optical network unit is received by the first optical line terminal and the second optical line terminal. In other words, the controller may be configured to assign the ONU to both neighboring OLTs at the same time, thereby allowing the ONU to transmit an optical burst which is received by both neighboring OLTs at the same time. The assigning of the ONU may comprise reserving or attributing a corresponding time slot on a respective uplink from the optical network unit to the first and the second optical line terminal.

This means that the optical burst would be transmitted concurrently within a time slot of the uplink of the first OLT and within a time slot of the uplink of the second OLT.

The media access controller may be configured to determine a first quality of the optical burst received by the first optical line terminal, and/or determine a second quality of the optical burst received by the second optical line terminal. The first and/or second quality may be a bit error rate of the data transmitted by the ONU within the optical burst. In particular, the first and/or second quality may be determined based on a bit parity or bit interface parity and/or forward error correction code and/or received signal strength indicator of the data comprised within the optical burst received by the first and/or second optical line terminal.

The media access controller may be configured to select a first portion of the optical burst received by the first optical line terminal based on the first quality, and/or to select a second portion of the optical burst received by the second optical line terminal based on the second quality. In particular, the controller may be configured to identify a first portion of the optical burst received by the first optical line terminal which has a higher quality than the corresponding portion of the optical burst received by the second optical line terminal. In a similar manner, the controller may be configured to identify a second portion of the optical burst received by the second optical tine terminal which has a higher quality than the corresponding portion of the optical burst received by the first optical line terminal. The first and the second portions may make up the total of the optical burst. Subsequently, the controller may be configured to determine a reconstructed optical burst from the first and second portions.

The media access controller may be configured to determine an estimate of the transmitter wavelength based on the first and second quality. In particular, the controller may be configured to determine that the transmitter wavelength lies within a transition or border range between the first and the second wavelength ranges. The controller may determine the estimate by comparing a ratio of the first over the second quality to a ratio of a center wavelength of the first wavelength range over a center frequency of the second wavelength range.

Alternatively or in addition, the media access controller may be configured to determine a temperature of the optical network unit. For this purpose the ONU may comprise a temperature sensor and the media access controller may be configured to retrieve temperature data from the temperature sensor of the ONU. The knowledge about the temperature of the ONU, possibly combined with information regarding the first and/or second quality, may enable the media access controller to determine an estimate of the transmitter wavelength.

Having the above knowledge about the transmitter wavelength, the media access controller may be configured to modify a length of the optical burst, in response to the determined estimate of the transmitter wavelength. The length of the optical burst may be increased by inserting a preamble to the optical burst. The modification of the length of the optical burst may be used to control a temperature increase of the ONU during the transmission of the optical burst. By controlling the temperature increase, the transmitter wavelength may be controlled. By way of example, it may be determined that the estimated transmitter wavelength lies within the border range. By modifying the length of the optical burst, the transmitter wavelength may be controlled such that is drifts outside the border range.

The media access controller may be configured to determine that the estimate of the transmitter wavelength lies at a predetermined wavelength distance from the second wavelength range. As a result from such determining, the controller may terminate the assignment of the optical network unit to the second optical line terminal. In other words, the controller may be configured to terminate the double assignment two the first and the second OLT, if it determines that the transmitter wavelengths lies sufficiently far way from the second wavelength range. As such, the controller may be configured to make use of double assignment only if the transmitter wavelength lies in a transition range or border range between the first and the second wavelength range.

According to a further aspect a passive optical network (PON) is described. As discussed above, the PON may comprise a first optical line terminal with a receiver for a first wavelength range; and/or a second optical line terminal with a receiver for a second wavelength range, adjacent to the first wavelength range; and/or an optical network unit with a transmitter having a transmitter wavelength which drifts between the first and the second wavelength range. Furthermore, the PON may comprise a media access controller according to any of the aspects outlined in the present document.

In particular, the PON may be a WDM PON and the first and second wavelength ranges may be wavelength division multiplex channels of a wavelength division multiplex passive optical network. In particular, the first and second wavelength ranges may have a width of 50 GHz. The passive optical network may be a wavelength set division multiplex passive optical network.

The passive optical network may comprise a first passband filter for the first wavelength range; and a second passband filter for the second wavelength range. The first and second passband filters may be designed to isolate the first wavelength range from the second wavelength range, such that an attenuation of the optical burst in either the first wavelength range or the second wavelength range is lower than a predetermined value. In other words, the first and second passband filters may be designed such that the optical burst is attenuated by less than the predetermined value for any transmitter wavelengths lying within the first and second wavelength ranges. At the same time, the first passband filter may provide an isolation from the second wavelength range, and the second passband filter may provide an isolation from the first wavelength range. The predetermined value may be a certain value exceeding the passband attenuation, i.e. the attenuation of the optical signal within the passband of the first and/or second passband filters. By way of example, the predetermined value may be the passband attenuation plus an additional attenuation of 3 dB.

According to another aspect, a method for operating a non-tunable optical network unit in a passive optical network is described. As outlined above, the passive optical network may comprise a first optical line terminal with a receiver for a first wavelength range; a second optical line terminal with a receiver for a second wavelength range, adjacent to the first wavelength range; and a optical network unit with a transmitter having a transmitter wavelength which drifts between the first and the second wavelength range. The method may comprise assigning the optical network unit to the first and the second optical line terminal, such that an optical burst transmitted by the optical network unit is received by the first optical line terminal and the second optical line terminal.

According to a further aspect, a software program is described. The software program may be stored on a computer-readable medium (which may be tangible or otherwise non-transitory) as instructions that are adapted for execution on a processor and for performing the aspects and features outlined in the present document when carried out on a computing device.

According to another aspect, a storage medium comprising a software program is described. The storage medium may be memory (e.g. RAM, ROM, etc.), optical media, magnetic media and the like. The software program may be adapted for execution on a processor and for performing the aspects and features outlined in the present document when carried out on a computing device.

According to a further aspect, a computer program product is described. The computer program product may comprise executable instructions for performing the aspects and features outlined in the present document when executed on a computing device.

It should be noted that the methods and systems including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

The claimed subject-matter is explained below in an exemplary manner with reference to the accompanying drawings, wherein FIG. 1 illustrates an example PON network;

PON is typically a point-to-multipoint, fiber to the premises network is architecture in which unpowered passive optical splitters are used to enable a single optical fiber to serve multiple premises, typically 32 up to 128. A PON comprises an Optical Line Termination or Terminal (OLT) at the service provider's central office and a number of Optical Network Units (ONUs) or Optical Network Terminals (ONT) near end users. A PON configuration reduces the amount of fiber and central office equipment required compared with point-to-point (PTP) architectures.

Downstream signals in PON are broadcast to each premise sharing a single feeder fiber. Upstream signals are combined using a Media Access Control (MAC) protocol based on Time Division Multiple Access (TDMA). The OLTs configure the served ONTs or ONUs in order to provide time slot assignments for upstream communication.

Figure 1:
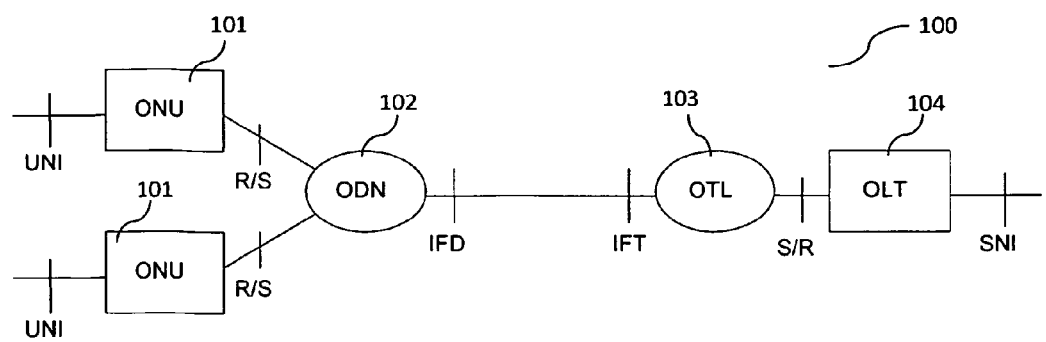

FIG. 1 illustrates an example PON network 100 with Optical Network Units (ONU) or Optical Network Terminals (ONT) 101 providing a User Network Interface (UNI). The ONUs 101 are connected to the Optical Distribution Network (ODN) 102 which may be implemented by an optical splitter/combiner. Via an Optical Trunk Line (OTL) 103, e.g. an optical fiber, the ONUs 101 are connected to the Optical Line Terminal (OLT) 104. As outlined above, the OLT 104 receives time multiplexed optical bursts on the upstream link from a plurality of ONUs 101.

Wavelength Division Multiplexing PON (WDM-PON) may be used for increasing the capacity of PON systems. The multiple wavelengths of a WDM-PON can be used to separate individual or groups of Optical Network Units (ONUs) into several virtual PONs co-existing on the same physical infrastructure. Typically, one wavelength of the WDM system is used for the downstream communication from a central office OLT (optical line terminal) to one or more ONUs, and another wavelength of the WDM system is used for the upstream communication from the one or more ONUs to the OLT. The downstream and upstream communication may be performed on the same or on separate fibers.

Figure 2:
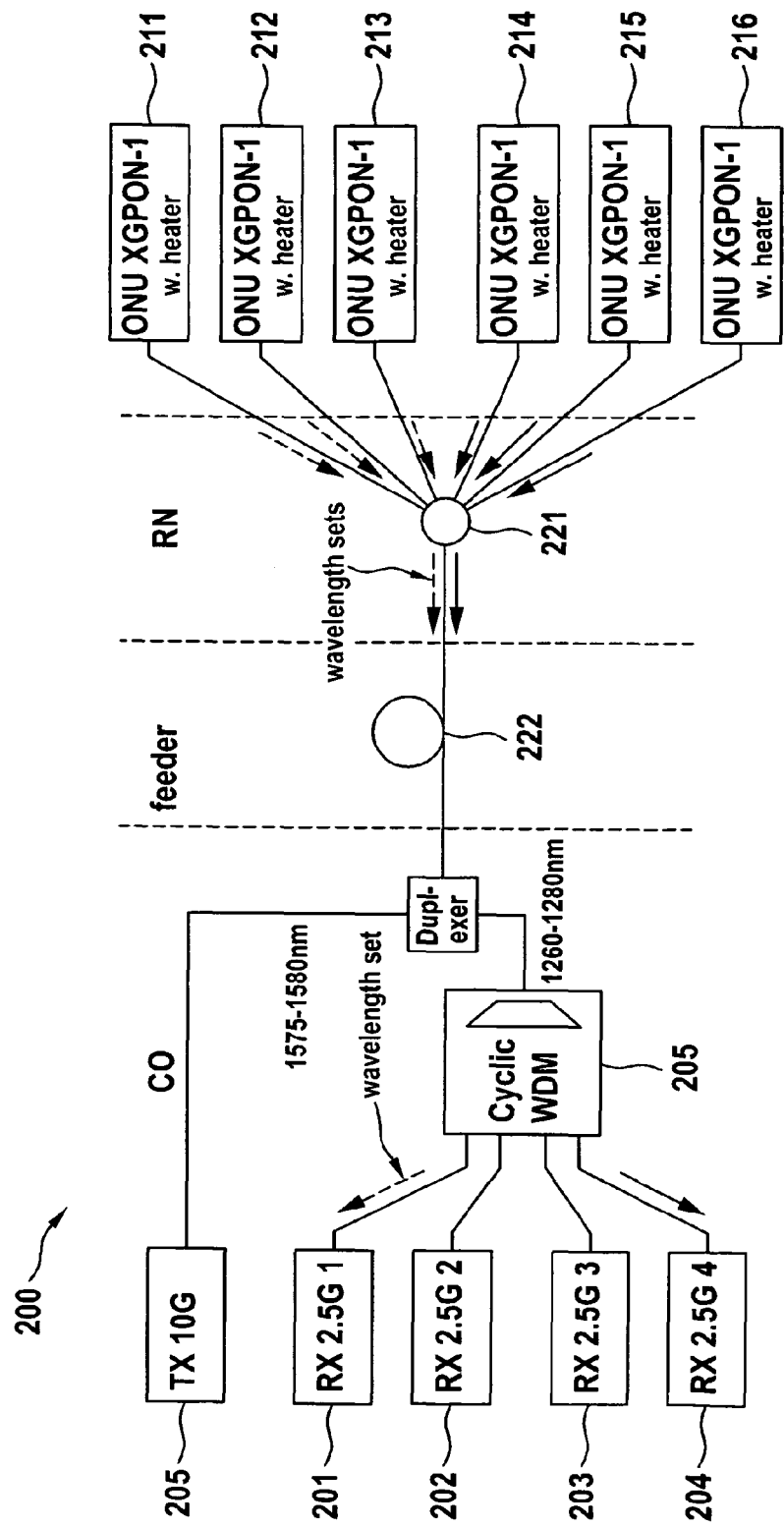
FIG. 2 illustrates an example WDM PON network using a cyclic to wavelength division multiplexer.

FIG. 2 illustrates an example WDM PON network 200 comprising a plurality of ONUs 211, 212, 213, 214, 215, 216 and a plurality of OLTs. FIG. 2 illustrates the upstream situation with a plurality of receivers 201, 202, 203, 204 of a plurality of corresponding OLTs. The downstream traffic is handled by a WDM transmitter 205 at the central office (CO). The WDM PON network further comprises an optical feeder (e.g. an optical fiber) 222 and a power splitting optical distribution network or a remote node (RN) 221 (e.g. an optical power splitter).

The example WDM PON network 200 of FIG. 2 comprises a cyclic wavelength division multiplexer 205, which allows the grouping of the different WDM wavelengths into sets of wavelength, wherein the wavelengths within the sets are spaced by a multiple of the underlying WDM grid (e.g. by a multiple of a 50 GHz grid). In the illustrated example, a 1 to 4 cyclic wavelength multiplexer 205 is shown, thereby yielding sets of wavelengths which are spaced by four times the underlying WDM grid (e.g. by 200 GHz). The use of cyclic wavelength multiplexers 205 may be beneficial when using heater tunable DFB (distributed feedback) lasers within the ONUs 211, . . . , 216.

The present document addresses the particular issues of coexistence of legacy non-tunable ONUs, e.g. an XG PON ONU, with tunable ONUs, e.g. a heater tunable XG PON ONU, in a Wavelength Division Multiplex PON. The methods and systems outlined herein are particularly beneficial in the context of wavelength set division multiplex (WSDM) PON networks, but can be used for WDM PONs in general. The following description will be based on the WSDM PON shown in FIG. 2, i.e. based on a WSDM PON using four wavelength sets. It should be noted, however, that the systems and methods outlined here may be applicable to any variant of WDM PON.

The tunable ONUs 211, . . . ,216 within a WSDM PON 200 are typically assigned to a particular channel within the WDM system, i.e. to a particular wavelength. The particular channel or the particular wavelength is assigned to a particular OLT which controls a particular PON within the WDM PON. In other words, a tunable ONU 211, . . . ,216 is assigned to a particular PON controlled by a particular OLT.

In contrary to tunable ONUs, legacy non-tuned ONUs tend to drift across different channels. In other words, non-tuned ONUs change their laser frequency or wavelength and therefore transmit in varying WDM channels. The change of the wavelength may be due to temperature changes of the laser during the transmission of an optical burst. A typical laser changes its laser wavelength with a gradient of about 0.08 nm/K, i.e. the laser wavelength increases by about 0.08 nm for every K (Kelvin) of temperature increase. Consequently, a non-tunable ONU may change a WDM channel even during the transmission of a single optical burst, during which the laser heats up. This drifting of the transmission wavelength of non-tunable ONUs may lead to the interference of a non-tunable ONU with the one or more tunable ONUs assigned to a particular WDM channel.

Figure 3:
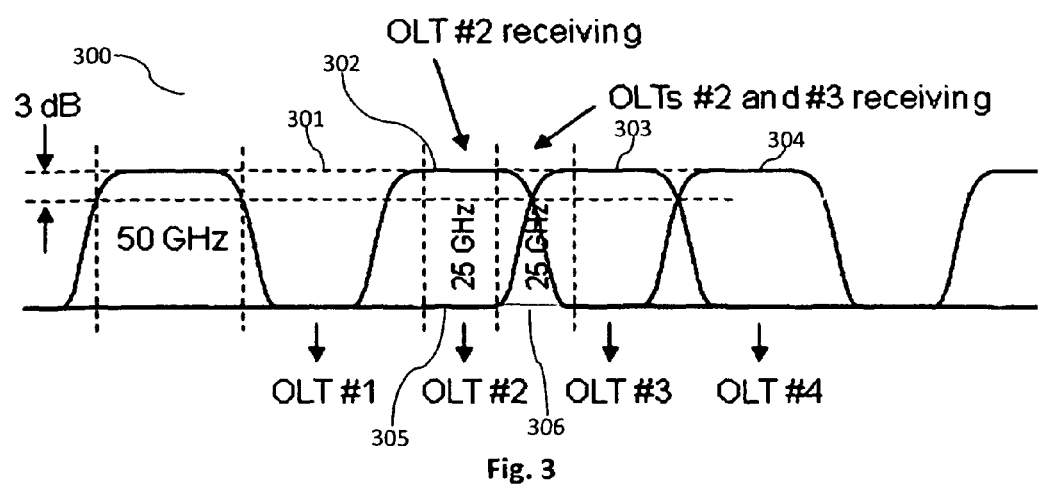
FIG. 3 illustrates an example WDM grid.

FIG. 3 illustrates an example WDM channel grid 300. The heater tuned ONUs 211, . . . ,216 may be tuned to the center of a passband 301, 302, 303, 304 of the WDM channel grid 300. As outlined above, legacy non heater tuned ONUs will typically drift across the four wavelength sets of the WSDM PON 200. As outlined above, a MAC (media access control) is used per channel, in order to control the traffic on the uplink of a particular WDM channel. In other words, a particular OLT uses a MAC to control the assignment of time slots on the uplink to the ONUs of the particular PON. By way of example, the MAC may assign the different time slots of the particular WDM channel to a plurality of ONUs which transmit on the uplink to the OLT. In order to perform its control task, the MAC has to be aware of the ONUs which want to transmit data on the particular WDM channel. Due to the fact, that non-tunable ONUs have changing laser wavelengths, they typically cannot be assigned to a particular WDM channel. Consequently, the MAC of the particular channel cannot be reliably enabled to assign time slots to the non-tunable ONU.

In order to overcome the above problem, it is suggested to make use of a so called Super-MAC protocol which coordinates the access to a plurality of WDM channels of a WDM PON. In particular, instead of only controlling the upstream traffic to one particular OLT (associated with one particular WDM channel), the Super-MAC is configured to control the upstream traffic to a plurality of OLTs (associated with a plurality of WDM channels, respectively).

In case of the WSDM PON shown in FIG. 2, a Super-MAC may take care of the administration of legacy (non-tunable) ONUs to the 4 wavelength sets. In a first step, the Super-MAC may assign the ONU-ID of the non tunable ONU to the current OLT (or to the current wavelength set). In such a situation, the upstream traffic is controlled by the MAC of the current OLT. However, during the drift process the non tunable ONU may drift to the edge of the passband of the current WDM channel and/or enter the passband of a neighboring WDM channel. In such a transitory situation, the Super-MAC may assign the non tunable ONU to two OLTs. Both OLTs, i.e. both PONs, wilt then reserve a timeslot for the legacy ONU to transmit upstream. In other words, the Super-MAC will control the transition of a non-tunable ONU between two PONs by requesting the MACs of the two PONs to both reserve resources on the uplink for the non-tunable ONU. Furthermore, the Super-MAC may coordinate the resource reservation process to ensure that the MACs of both PONs reserve aligned time slots on which the non-tunable ONU can transmit.

By using such a Super MAC, it can be ensured that the non-tunable ONU does not interfere with the transmission of ONUs in adjacent PONs, i.e. in adjacent WDM channels. As long as the number of legacy non-tunable ONUs within a WDM PON is relatively low, the usable bandwidth will not be strongly affected by the double assignment of non-tunable ONUs to two adjacent PONs.

As discussed above, the drifting of non-tunable ONUs across different WDM channels may be addressed by a Super-MAC which performs the dynamic bandwidth allocation (DBA) of the four wavelength sets of the WSDM PON 200 shown in FIG. 2. More generally, the Super-MAC may perform the DBA to the different WDM channels (or the different PONs) of a WDM PON. An uncontrolled ONU that enters the crossover region between two WDM channels will have to be assigned to both wavelength sets. This crossover region is typically provided by the passband filters of the two WDM channels. The passbands 301, 302, 303, 304 of such filters are illustrated in FIG. 3. As a result of assigning the non-tunable ONU to two WDM channels (i.e. to two wavelength sets of the WSDM PON) both wavelength sets reserve a time slot for the non-tunable ONU and the signal will be received in both receivers, when the uncontrolled ONU is allowed to send upstream.

It has already been indicated that the OLTs typically make use of passband filters in order to clearly delimit the adjacent WDM channels from one another. This is illustrated in FIG. 3, where the passband range 305 of filter 302 and the transition range 306 of filter 302 are shown. It can be seen that within the transition range 306, the attenuation of an incoming signal continuously increases as the wavelength of the incoming signal increases. At the same time, it can be seen that the transition range 306 of the neighboring passband filter 303 overlaps with the transition range 306 of filter 302. Consequently, the attenuation of an incoming signal in the neighboring WDM channel (provided by OLT #3) continuously decreases as the wavelength of the signal increases.

Typical passband filters 302, 303 are designed, in order to have a relatively steep transition range 306. In other words, the filters 302, 303 are designed to ensure a strong selectivity between neighboring WDM channels, i.e. filters 302, 303 with little to no overlap within the transition range 306 are used. As outlined above, the wavelength of an upstream signal of a non-tunable ONU may drift into the transition range 306 between the passband filters 302, 303 of two adjacent OLTs (OLT #2 and OLT #3). A strong selectivity of the passband filters 302, 303 will lead to a strong attenuation of the upstream signal of the non-tunable ONU at the transition between OLT #2 and OLT #3. This means that even though the non-tunable ONU may transmit on both PONs, neither of the two PONs (i.e. neither of OLT #2 and OLT #3) may be able to reliably receive the upstream signal.

In view of the above, it is suggested to design the passband filters 301, 302, 303, 304 of the WDM PON such that the maximum attenuation incurred by an upstream signal in the transition range 306 between two adjacent WDM channels is below a predetermined value in either one of the two adjacent WDM channels. The predetermined value may be 3 dB.

As a consequence, by drifting from one OLT to the other, the worst attenuation incurred by an upstream signal is when the wavelength is at the crossing of the edges. At this wavelength at the crossing of the edges an additional attenuation of 3 dB will occur.

In other words, it is proposed to design WDM filters (or cyclic WDM filters) with overlapping passbands. By this design, any wavelength can be received in one of the (four) OLT receivers with a max. additional attenuation of e.g. 3 dB. As a drawback of this design, the isolation requirements between the (four) WDM channels may be more challenging. However, the isolation requirements can typically be met by adjusting the controlled (i.e. tunable) ONUs to the center of the passband of filters 302, 303.

As outlined above, a Super-MAC may be used to control the assignment of non-tunable ONUs to one or more of the OLTs. The Super-MAC may be configured to monitor the received signal quality of a signal received at one or more OLTs from a non-tunable ONU. The received signal quality, notably the bit error rate (BER) of the received signal, may be estimated by analyzing the bit interface parity (BIP) and/or forward error correction (FEC) code and/or the received signal strength indicator (RSSI) of the received signal (i.e. of the received optical burst). These indicators may provide the Super-MAC with a fast estimate of the BER of the received signal.

By analyzing BIP or FEC, the Super-MAC can decide which OLT receives the better quality of the legacy ONUs upstream message. The Super-MAC may use the quality information to determine if the non-tunable ONU transmits on a wavelength which is close to or within a first WDM channel or which is rather close to or within a second WDM channel. Consequently, the Super-MAC can estimate the approximate wavelength of the transmitting non-tunable ONU.

Furthermore, the Super-MAC can select data from all the OLTs which receive the upstream data of the non-tunable ONU. If the legacy ONU sends in a filter cross point between two adjacent OLTs, the cross point penalty can be reduced by comparing the two FEC protected data streams in the OLTs and by selecting the data stream that has no or a minimum of uncorrectable errors. By doing this, the penalty due to the increased attenuation at the cross point between two filters 302, 303 may be reduced to 2 or 2.5 dB (in case of a cross point attenuation of 3 dB).

Figure 4:
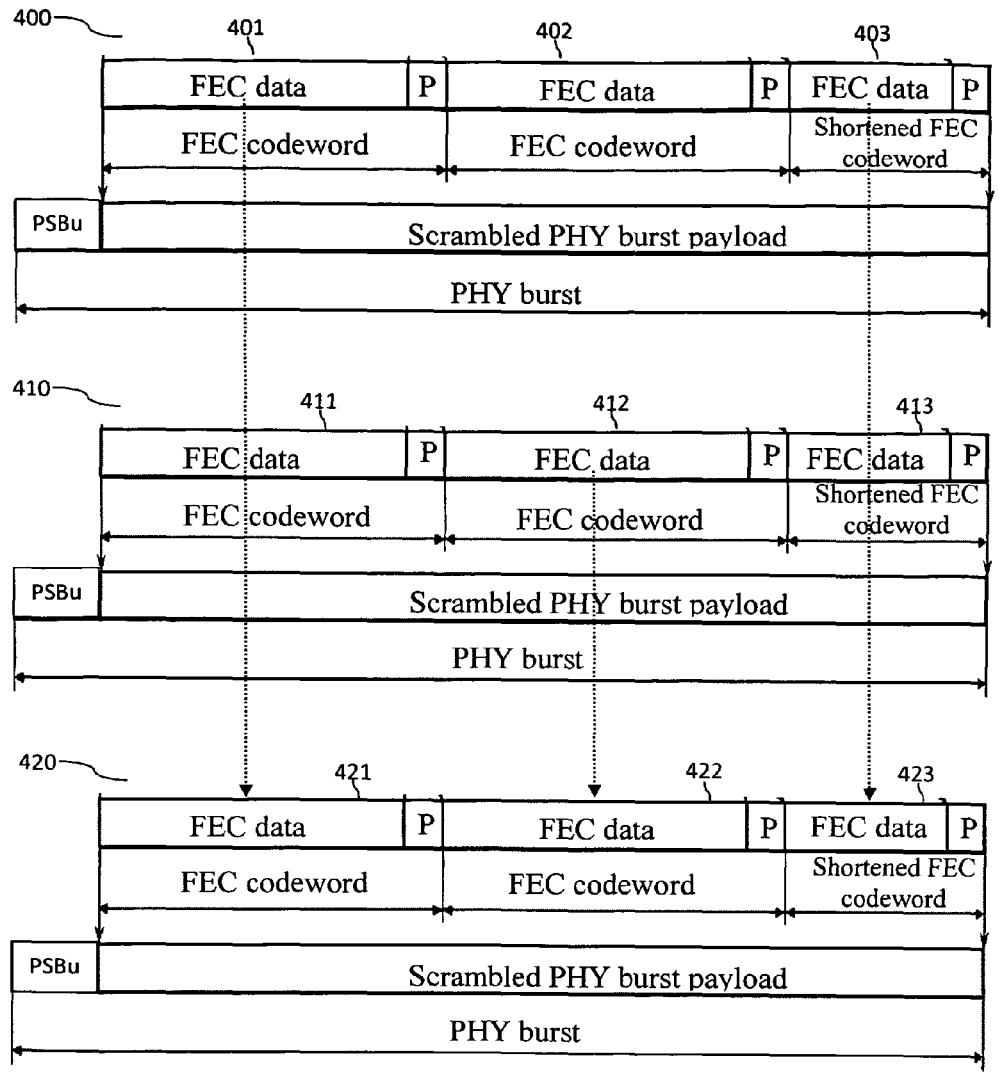
FIG. 4 illustrates example optical bursts received by a plurality of OLTs.

As such, the Super-MAC may be configured to compare and optimize the quality of the signals received from the non-tunable ONU in the crossing region 306 between two adjacent OLTs. The quality of the received signal (BER) can be judged by fast RSSI, BIP or FEC parity. As the signal is received on two paths (i.e. in two WDM channels), the Super-MAC can reconstruct the received signal by combining error-free portions received at both OLTs (i.e. OLT #2 and OLT #3). This is shown in FIG. 4 which illustrates an optical burst 400 received by a first OLT (e.g. OLT#2) and the corresponding optical burst 410 received by a second (neighboring) OLT (e.g. OLT#3). The two optical bursts 400, 410 correspond to a single optical burst which has been transmitted by the non-tunable ONU. The non-tunable ONU has been assigned to the first and the neighboring second OLT.

The optical burst 400 comprises payload data and a plurality of FEC codewords 401, 402, 403 corresponding to respective portions of the payload data. The burst 410 comprises payload data and a plurality of FEC codewords 411, 412, 413 corresponding to the same respective portions of the payload data as optical burst 400. However, due to transmission errors on the first and second PON (i.e. on the first and second WDM channel), the received payload data and the FEC codewords may be different.

The Super-MAC may verify the FEC data 401, 402, 403 of the first optical burst 400 and the FEC data 411, 412, 413 of the second optical burst 410. Based on this verification, the Super-MAC may select error-free portions of the payload data. By way of example, the Super-MAC may select the payload data corresponding to FEC codewords 401 and 403 from the first optical burst 400, and the payload data corresponding to FEC codewords 402 from the second optical burst 410. This is illustrated is by the arrows in FIG. 4. By doing this, an error-free or at least an error-reduced optical burst 420 may be generated which comprises payload data from both received optical bursts 400, 410 corresponding to the FEC codewords 421, 422, 423. As a result of the combination of the two received optical bursts 400, 410, a part of the additional penalty caused by the filter attenuation at the cross point (e.g. the attenuation of 3 dB) can be compensated.

As outlined above, the Super-MAC may be configured to determine the approximate wavelength of the non-tunable ONU. This may be done by analyzing the quality of the signals received from the non-tunable ONU within two neighboring WDM channels. As has been discussed, the upstream signal of a non-tunable ONU typically incurs attenuation, if the wavelength of the upstream signal is within the transition range 306 between adjacent WDM channels. This attenuation may be reduced by an appropriate design of the passband filters 302, 303 of the WDM channels. Nevertheless, it is desirable that this transition range 306 is not used by the uncontrolled ONU for a long time. In other words, it is desirable to provide a method for operating the uncontrolled ONU only for a very short time within the crossing region 306. In particular, this is desirable in order to ensure a reasonable BER of the upstream traffic of the non-tunable ONU. Furthermore, this is desirable because outside the transition range 306, the non-tunable ONU may be assigned to only a single WDM channel, thereby reducing the bandwidth required by the non-tunable ONU.

In a typical wavelength grid of 50 GHz, the crossing region 306 will have a width of approx 5-10 GHz. As indicated above, this range 306 should not be used by the uncontrolled ONU for a long time. This can be accomplished by using the self heating property of the uncontrolled ONUs laser chip during the burst. By way of example, if the wavelength has to be kept low, the burst should be short to keep the lasers temperature low. If the wavelength should be increased to pass the is crossing region 306, the burst should be long to heat up the laser chip.

The gradient of the wavelength/temperature function is about 0.08 nm/K. In other words, it is proposed to control the length of an optical burst transmitted by a non-tunable ONU, in order to control the wavelength of the optical burst transmitted by the non-tunable ONU. By way of example, the length of an optical burst may be increased by a special preamble with a high content of "1". In yet other words, due to self heating of the laser with the non-tunable ONU, there is a certain wavelength drift over the length of the transmission of an optical burst. Therefore a "tuning" of the burst length may be used to pass the crossing range 306.

In addition, the bias current of the non-tunable ONU may be changed, in order to pass the critical part of the transition range 306 (which may have a width of less than 5 GHz) quickly by applying an additional bias current. The gradient of the frequency/bias current function is about 500 MHz/mA.

In the present document, methods and systems for operating non-tunable ONUs within a WDM PON have been described. The proposed methods and systems allow the reuse of legacy (non-tunable) ONUs in the context of WDM PON using tunable ONUs. A Super-MAC is described which allows the assignment of a non-tunable ONU to one or more WDM channels. For this purpose, the Super-MAC may be configured to track the transmitting wavelength of the non-tunable ONU. Furthermore, the Super-MAC may be configured to control (at least partly) the transmitting wavelength of the non-tunable ONU, e.g. through the modification of the length of transmitted optical bursts. In addition, it is outlined how an appropriate filter design may improve the performance of non-tunable ONUs in a WDM PON.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Furthermore, it should be noted that steps of various above-described methods and components of described systems can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

In addition, it should be noted that the functions of the various elements described in the present patent document may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

Finally, it should be noted that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The invention claimed is:

1. A media access controller for a passive optical network, wherein
    the passive optical network comprises a first optical line terminal with a receiver for a first wavelength range; a second optical line terminal with a receiver for a second wavelength range, adjacent to the first wavelength range; and an optical network unit with a transmitter having a transmitter wavelength which drifts between the first and the second wavelength range;
    the media access controller is adapted to assign the optical network unit to the first and the second optical line terminal, such that an optical burst transmitted by the optical network unit is received by the first optical line terminal and the second optical line terminal;
    the media access controller is adapted to determine a first quality of the optical burst received by the first optical line terminal;
    the media access controller is adapted to determine a second quality of the optical burst received by the second optical line terminal; and
    the media access controller is adapted to determine an estimate of the transmitter wavelength based on the first and second quality.

2. The media access controller of claim 1, wherein assigning comprises reserving a corresponding time slot on a respective uplink from the optical network unit to the first and the second optical line terminal.

3. The media access controller of claim 1, wherein the first and/or second quality is a bit error rate.

4. The media access controller of claim 1, wherein
    the first and/or second quality is determined based on a bit parity and/or forward error correction code and/or received signal strength indicator of the optical burst received by the first and/or second optical line terminal.

5. The media access controller of claim 1, further adapted to
    select a first portion of the optical burst received by the first optical line terminal based on the first quality;

select a second portion of the optical burst received by the second optical line terminal based on the second quality; and determine a reconstructed optical burst from the first and second portions.

6. The media access controller of claim 1, further adapted to modify a length of the optical burst, in response to the determined estimate of the transmitter wavelength.

7. The media access controller of claim 6, wherein the length of the optical burst is increased by inserting a preamble to the optical burst.

8. The media access controller of claim 1, further adapted to determine that the estimate of the transmitter wavelength lies at a predetermined wavelength distance from the second wavelength range; and terminate the assignment of the optical network unit to the second optical line terminal.

9. A passive optical network comprising a first optical line terminal with a receiver for a first wavelength range;

a second optical line terminal with a receiver for a second wavelength range, adjacent to the first wavelength range;

an optical network unit with a transmitter having a transmitter wavelength which drifts between the first and the second wavelength range; and a media access controller according to claim 1.

10. The passive optical network of claim 9, further comprising a first passband filter for the first wavelength range;

a second passband filter for the second wavelength range; wherein the first and second filters are designed to isolate the first wavelength range from the second wavelength range, such that an attenuation of the optical burst in either the first wavelength range or the second wavelength range is lower than a predetermined value.

11. The passive optical network of claim 10, wherein the predetermined value is a passband attenuation plus 3dB.

12. The passive optical network of claim 9, wherein the first and second wavelength ranges are wavelength division multiplex channels of a wavelength division multiplex passive optical network; and/or the optical network unit is a non-tunable optical network unit; and/or the passive optical network is a wavelength set division multiplex passive optical network; and/or the first and second wavelength ranges have a width of 50GHz.

13. A method for operating a non-tunable optical network unit in a passive optical network, wherein the passive optical network comprises a first optical line terminal with a receiver for a first wavelength range; a second optical line terminal with a receiver for a second wavelength range, adjacent to the first wavelength range; and the optical network unit with a transmitter having a transmitter wavelength which drifts between the first and the second wavelength range; and wherein the method comprises:

assigning the optical network unit to the first and the second optical line terminal, such that an optical burst transmitted by the optical network unit is received by the first optical line terminal and the second optical line terminal;

determining a first quality of the optical burst received by the first optical line terminal;

determining a second quality of the optical burst received by the second optical line terminal; and determining an estimate of the transmitter wavelength based on the first and second quality.

* * * * *